(12) United States Patent
Botula et al.

(10) Patent No.: US 8,089,126 B2
(45) Date of Patent: Jan. 3, 2012

(54) METHOD AND STRUCTURES FOR IMPROVING SUBSTRATE LOSS AND LINEARITY IN SOI SUBSTRATES

(75) Inventors: Alan Bernard Botula, Essex Junction, VT (US); David S. Collins, Williston, VT (US); Alvin Jose Joseph, Williston, VT (US); Howard Smith Landis, Underhill, VT (US); James Albert Slinkman, Montpelier, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/507,150

(22) Filed: Jul. 22, 2009

(65) Prior Publication Data

US 2011/0018060 A1 Jan. 27, 2011

(51) Int. Cl.
*H01L 27/12* (2006.01)

(52) U.S. Cl. .............. 257/347; 257/349; 257/E29.287; 438/164; 438/183

(58) Field of Classification Search .............. 257/347, 257/349, E29.287; 438/164, 183
See application file for complete search history.

(56) References Cited

U.S. PATENT DOCUMENTS

| | | | |
|---|---|---|---|
| 6,258,688 B1 | 7/2001 | Tsai | |
| 6,611,041 B2 | 8/2003 | Maeda et al. | |
| 6,835,981 B2 * | 12/2004 | Yamada et al. | 257/347 |
| 6,893,907 B2 | 5/2005 | Maydan et al. | |
| 6,992,355 B2 | 1/2006 | Mouli | |
| 7,273,797 B2 | 9/2007 | Mouli | |
| 7,358,161 B2 | 4/2008 | Mouli | |
| 2007/0138557 A1 * | 6/2007 | Ipposhi | 257/347 |

OTHER PUBLICATIONS

Baine et al.; Cross-Talk Suppression in SOI Substrates; Solid-State Electronics, vol. 49, Issue 9, Sep. 2005; pp. 1461-1465.

* cited by examiner

*Primary Examiner* — Phat Cao
(74) *Attorney, Agent, or Firm* — Schmeiser, Olsen & Watts; David A. Cain

(57) ABSTRACT

Methods and structures for improving substrate loss and linearity in SOI substrates. The methods include forming damaged crystal structure regions under the buried oxide layer of SOI substrates and the structures included damaged crystal structure regions under the buried oxide layer of the SOI substrate.

5 Claims, 15 Drawing Sheets

*FIG. 1A1*

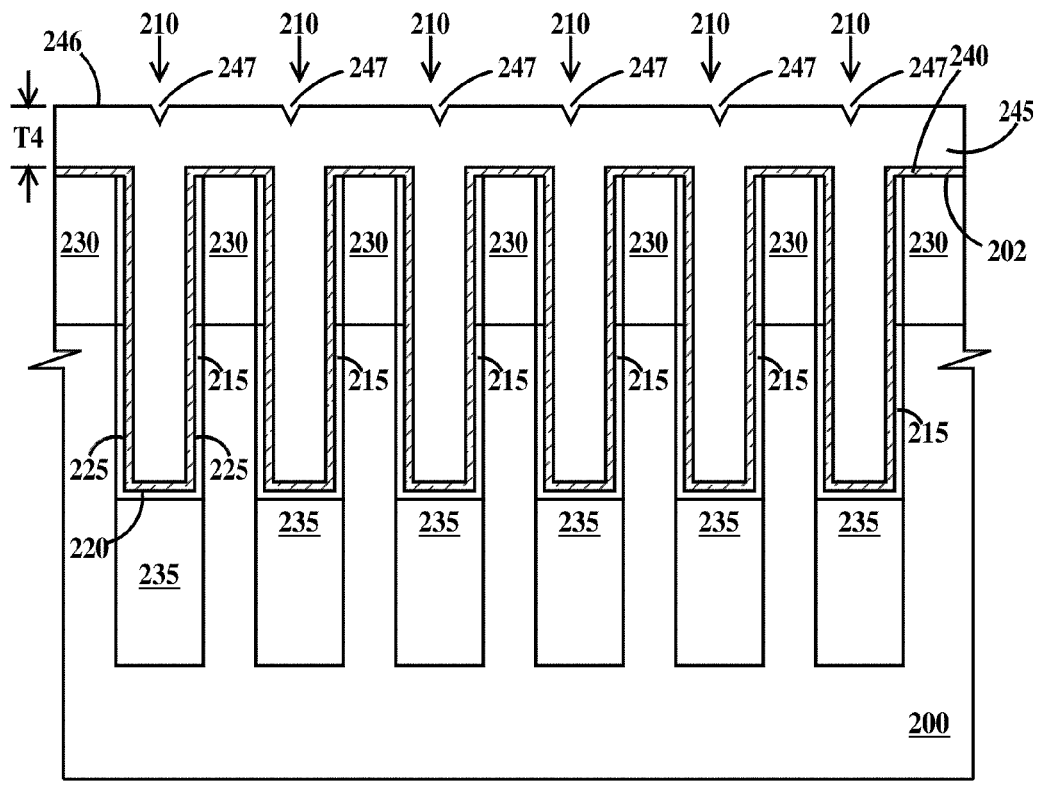
*FIG. 3F*
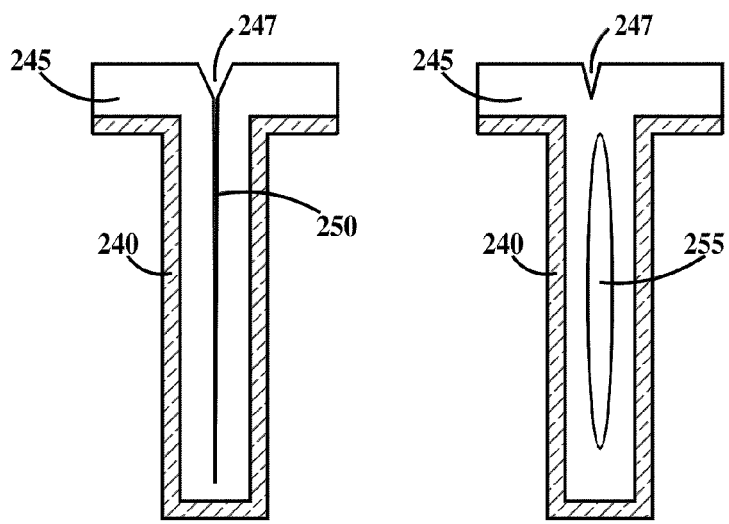
*FIG. 3F1*  *FIG. 3F2*

METHOD AND STRUCTURES FOR IMPROVING SUBSTRATE LOSS AND LINEARITY IN SOI SUBSTRATES

FIELD OF THE INVENTION

The present invention relates to the field of integrated circuits; more specifically, it relates to methods and structures for improving loss and linearity in SOI substrates.

BACKGROUND OF THE INVENTION

Silicon-on-insulator (SOI) substrates are comprised of a thin semiconductor layer separated from a supporting substrate by a buried oxide (BOX) layer. In many integrated circuits, such as radio frequency (RF) circuits fabricated on SOI substrates performance of the circuit has not been as expected. Accordingly, there exists a need in the art to mitigate or eliminate the deficiencies and limitations described hereinabove.

SUMMARY OF THE INVENTION

A first aspect of the present invention is a method, comprising: (a) forming gate structures in an active region and dummy gate structures in an inactive region and on a top surface of a silicon layer separated from a supporting substrate by a buried oxide layer; (b) removing the dummy gate structures and the buried oxide layer from the inactive regions to form a trench extending through the silicon layer and the buried oxide layer to the substrate; (c) ion implanting an electrically inert species into the substrate in the inactive regions and not into gate structures, the silicon layer, the buried oxide layer and the substrate in the active regions; and (d) depositing a dielectric material over the active and inactive regions to form a dielectric layer, the dielectric material filling the trench.

A second aspect of the present invention is a structure, comprising: a silicon layer separated from a supporting substrate by a buried oxide layer in an active region of the substrate and a trench extending from the top surface of the silicon layer, through the silicon layer and the buried oxide layer to the substrate; gate structures in the active region and on a top surface of a silicon layer; an ion implanted region of an electrically inert species in the substrate in the inactive region and not in the gate structures, the silicon layer, the buried oxide layer and the substrate in the active regions; and a layer of a dielectric material over the active and inactive regions, the dielectric material filling the trench.

A third aspect of the present invention is a method, comprising: (a) forming trenches in a silicon first substrate; (b) ion implanting an electrically inert species in regions of the first substrate exposed in bottoms of the trenches; (c) forming a dielectric layer on a top surface of the first substrate and sidewalls and the bottoms of the trenches; (d) forming a layer of polysilicon over the dielectric layer and in the trenches; (e) oxidizing a top surface of the polysilicon layer to form a first oxide layer on the polysilicon layer; and (f) bonding a top surface of a second oxide layer on a top surface of a second silicon substrate to a top surface of the first oxide layer form a buried oxide layer.

A fourth aspect of the present invention is a structure, comprising: trenches in a silicon first substrate; a layer of an electrically inert species in regions of the first substrate exposed in bottoms of the trenches; a dielectric layer on a top surface of the first substrate and sidewalls and the bottoms of the trenches; a layer of polysilicon over the dielectric layer and in the trenches; an oxide layer on the polysilicon layer; and a second silicon layer on a top surface of the oxide layer.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 3A through 3L are cross-sections illustrating fabrication of a SOI substrate according to embodiments of the present invention.

DETAILED DESCRIPTION OF THE INVENTION

In SOI substrates, it has been found that at the supporting substrate/silicon oxide (i.e., BOX) interface a weak inversion layer is formed. Mobile electrons can move in and out of this inversion layer leading to power loss and non-linear parasitic capacitive coupling between the devices formed in the upper single-crystal silicon layer and the supporting substrate. The power loss and non-linear parasitic capacitance reduce the performance of the integrated circuit, particularly at signal frequencies of about 100 MHz or greater. The methods of the present invention, by damaging the silicon crystal lattice at this interface, create traps to fix the mobile electrons thereby reducing power loss and increasing the linearity of the parasitic coupling by reducing the number of electrons that are moved by the electric fields across the inversion layer.

Figure 1A:
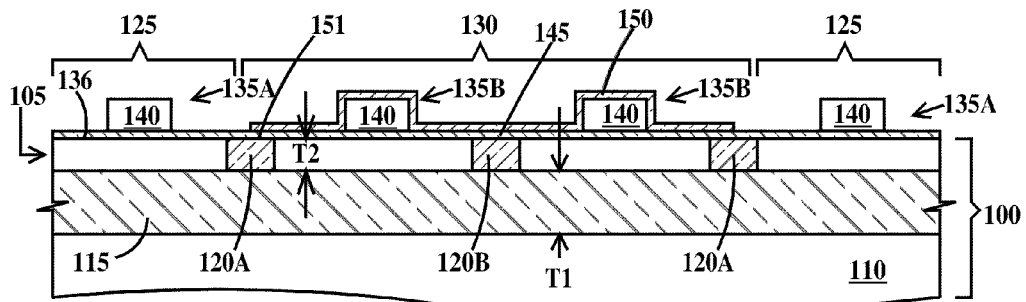
FIGS. 1A through 1K are cross-sections illustrating fabrication of an integrated circuit according to embodiments of the present invention.

FIGS. 1A through 1K are cross-sections illustrating fabrication of an integrated circuit according to embodiments of the present invention. In FIG. 1A, an SOI substrate 100 includes a silicon layer 105 separated from a supporting substrate 110 by a BOX layer 115. Formed in layer 105 are dielectric trench isolation 120A and dielectric dummy trench isolation 120B. Substrate 100 is divided into active regions 125 and inactive regions 130 (there may be multiple inactive regions, but only one is illustrated). Trench isolation 120A is formed in layer 105 and gate structures 135A are formed on a top surface 136 of semiconductor layer in active regions 125. Dummy trench isolation 120B is formed in layer 105 and dummy gate structures 135B are formed on top surface 136 of semiconductor layer in inactive regions 130.

In FIG. 1A1, it can be seen that gate structures 135A comprise a gate electrode 140 (e.g., polysilicon) over a portion of a gate dielectric layer 145 and dummy gate structures 135B comprise a gate electrode 140 over a portion of a gate dielectric layer 145 and an optional protective layer 150 (e.g., silicon nitride). Trench isolation 120A and dummy trench isolation 120B are formed simultaneously. Gate structures 135A and dummy gate structures 135B are fabricated simultaneously after which the protective layer 150 is removed from active regions 125.

Returning to FIG. 1A, the broad processes sequence used to fabricate the structure of FIG. 1A are, in order: (1) form trench isolation 120A and dummy trench isolation 120B in semiconductor layer 105, (2) form gate dielectric layer 145, and (3) form gate electrodes 140 (see FIG. 1A1), and (4) remove protective layer 150 from active regions 125. Trench isolation 120A and dummy trench isolation 120B are fabricated by etching trenches in semiconductor layer 105, filling the trench with an insulator such as high-density plasma (HDP) silicon oxide, and performing a chemical-mechanical polish (CMP) so top surfaces 151 of dielectric isolation 120 are coplanar with top surface 136 of semiconductor layer 105. Gate electrodes 140 (see FIG. 1A1) are formed by deposition and etching of the gate material. Because CMP process requires a relatively uniform pattern density to remove material uniformly, dummy trench isolation is placed in inactive regions 130 so the area of trench isolation is about the same (or within acceptable limits) in both active and inactive regions. Because, the etch processes (e.g., reactive ion etch (RIE)) requires a relatively uniform pattern density to achieve small dimensional tolerances, dummy gates are placed in inactive regions 130 so the area of dummy gates is about the same (or within acceptable limits) in both active and inactive regions.

BOX layer 115 has a thickness T1. In one example T1 is between about 400 nm and about 1000 nm thick. Semiconductor layer 105 has a thickness T2. In one example, T2 is between about 80 nm and about 200 nm thick. In one example, semiconductor layer 105 is single-crystal silicon (Si). In one example, supporting substrate 110 is single-crystal silicon. In one example, protective layer 150 is silicon nitride.

Figure 1B:
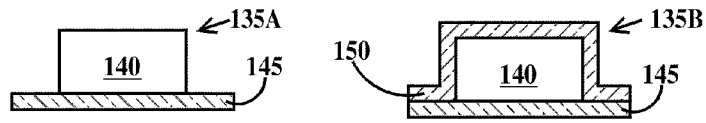
Figure 1B:
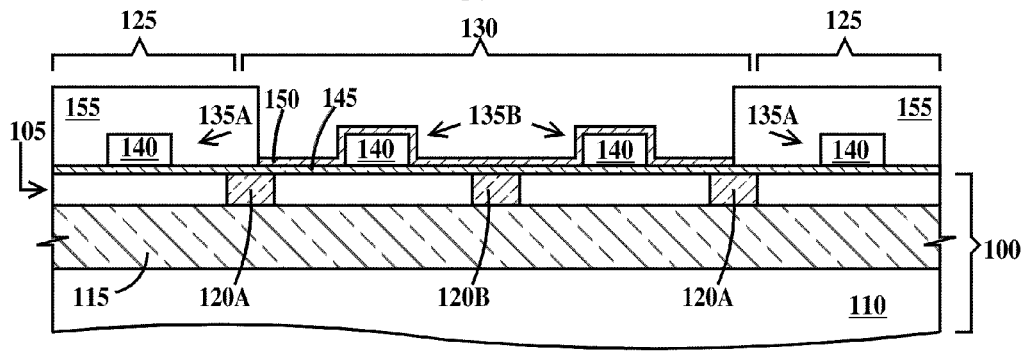

In FIG. 1B, a patterned photoresist layer 155 is formed over active regions 125, but not over inactive regions 130 using a photolithographic process. A photolithographic process is one in which a photoresist layer is applied to a surface of a substrate, the photoresist layer exposed to actinic radiation through a patterned photomask and the exposed photoresist layer developed to form a patterned photoresist layer.

Figure 1C:
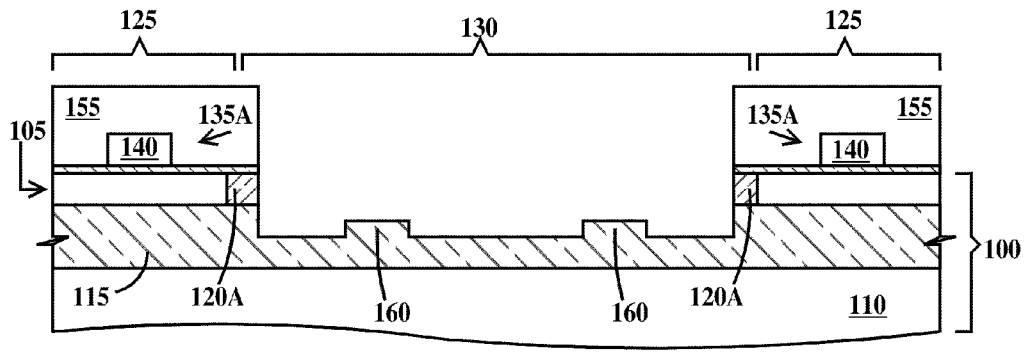

In FIG. 1C, a timed and non-selective etch (e.g., a nonselective RIE) is performed to remove all of protective layer 150, gate dielectric layer 145, gate electrodes 140, dummy trench isolation 120B (see FIGS. 1A1 and 2) and less than a full thickness of BOX layer 115 where not protected by photoresist layer 155. High regions 160 of the etched BOX layer 115 are artifacts of the presence of gate electrodes 140 (See FIG. 1B) prior to etching.

Figure 1D:
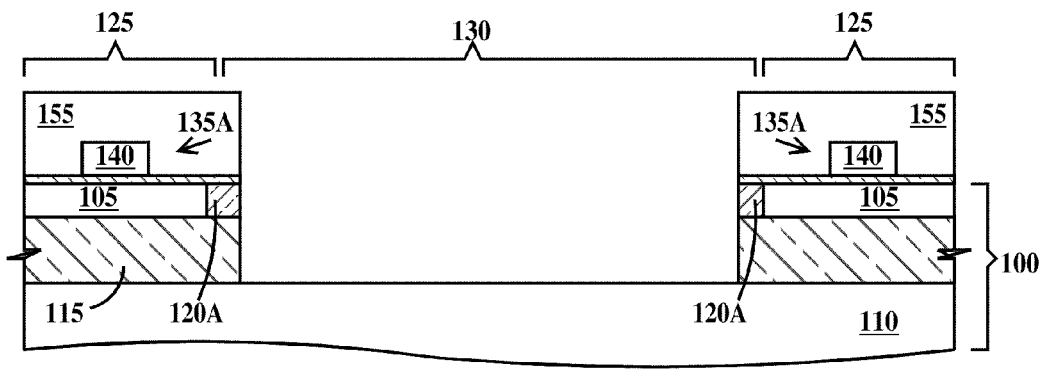

In FIG. 1D, a selective etch (e.g. selective RIE) is performed to remove any BOX 110 not removed by the etch of FIG. 1C in inactive region 130 and expose supporting substrate 110 in the inactive region. The selective etch, is selective to $SiO_2$ over Si (i.e., $SiO_2$ etches faster than Si).

Figure 1E:
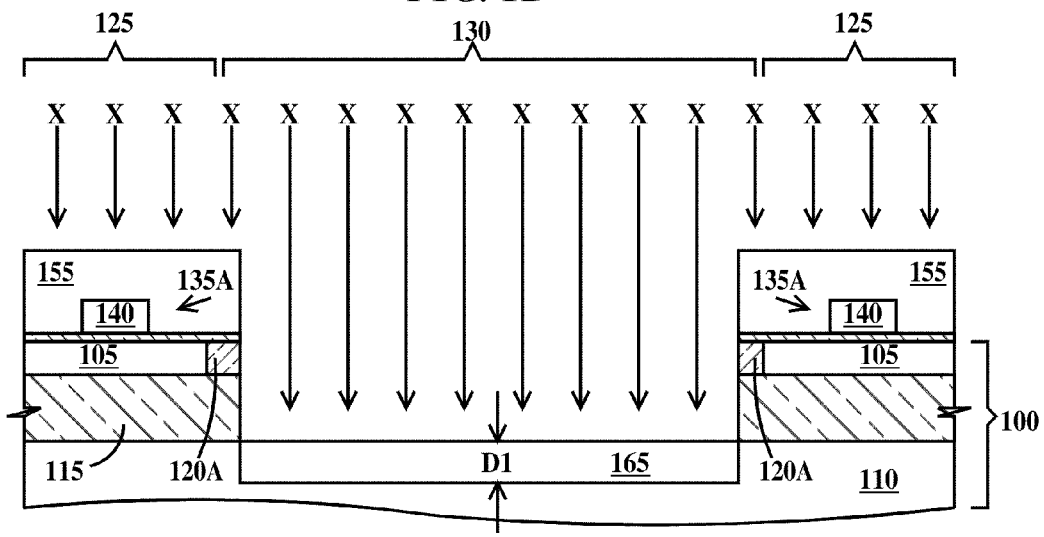

In FIG. 1E an ion implantation of an electrically inert species X is performed to form an implanted and damaged region 165 of depth D1 in supporting substrate 110 in inactive region 130/regions of substrate 100 not protected by photoresist layer 155. Inert species X is selected from the group consisting argon (Ar), neon (Ne), krypton (Kr), and xenon (Xe), with Ar preferred. In one example, the ion implantation is performed at an energy of between about 25 KeV and about 700 KeV and at a dose of between about 1E15 atm/cm$^2$ and 1E16 atm/cm$^2$. The ion implantation of species X does not penetrate into gate structures 135A, layer 105, box layer 115 or substrate 110 in active regions 125.

Figure 1F:
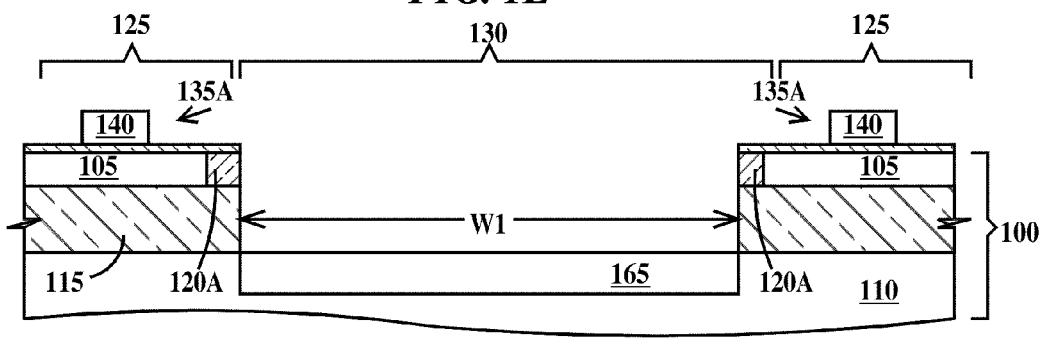

In FIG. 1F, photoresist layer 155 (see FIG. 1E) is removed. In one example, the largest dimension W1 of inactive region is greater than about 2 microns. In one example, inactive region has dimensions between about 0.8 microns and 300 microns. In one example, the ion implantation is performed at an energy of between about 25 KeV and about 700 KeV and at a dose of between about 1E15 atm/cm$^2$ and 1E15 atm/cm$^2$.

Figure 1G:
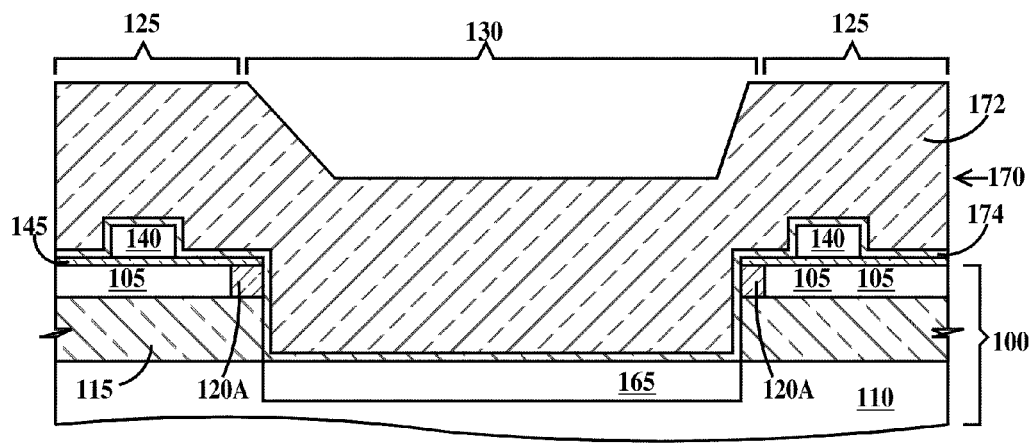

In FIG. 1G, a dielectric layer 170 is deposited over active and inactive regions 125 and 130. In one example dielectric layer 170 comprises a layer 172 of boro-phosphorous-silicate glass (BPSG) over an optional layer of silicon nitride 174. In one example, when there is no silicon nitride layer 174, BPSG layer 175 is between about 1500 nm and about 2500 nm thick. In one example, when dielectric layer 170 comprises BPSG layer 172 silicon nitride layer 174, the silicon nitride layer between about 20 nm and about 100 nm thick and the BPSG layer between about 1450 nm and about 2450 nm thick.

Figure 1H:
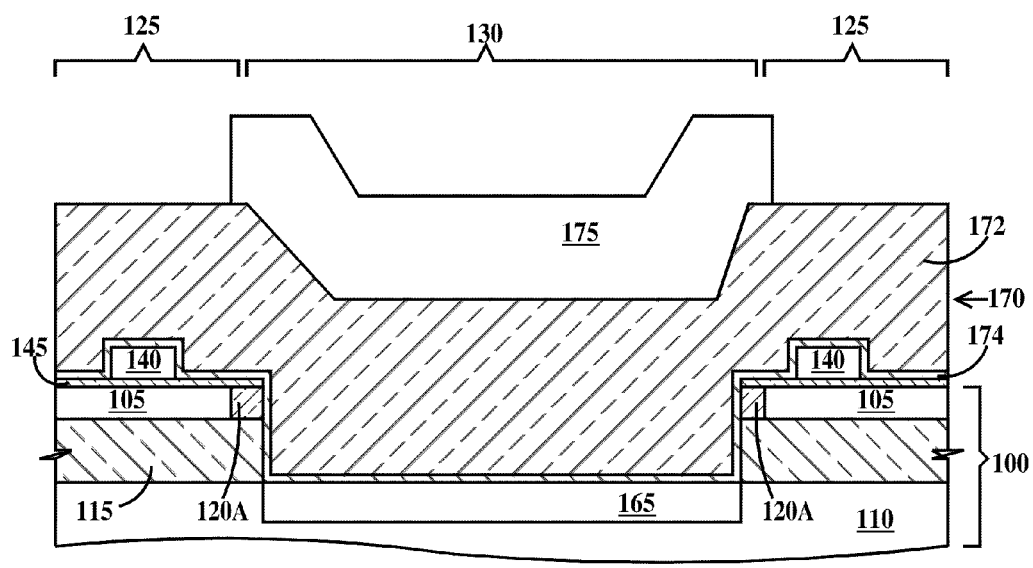
Figure 1I:
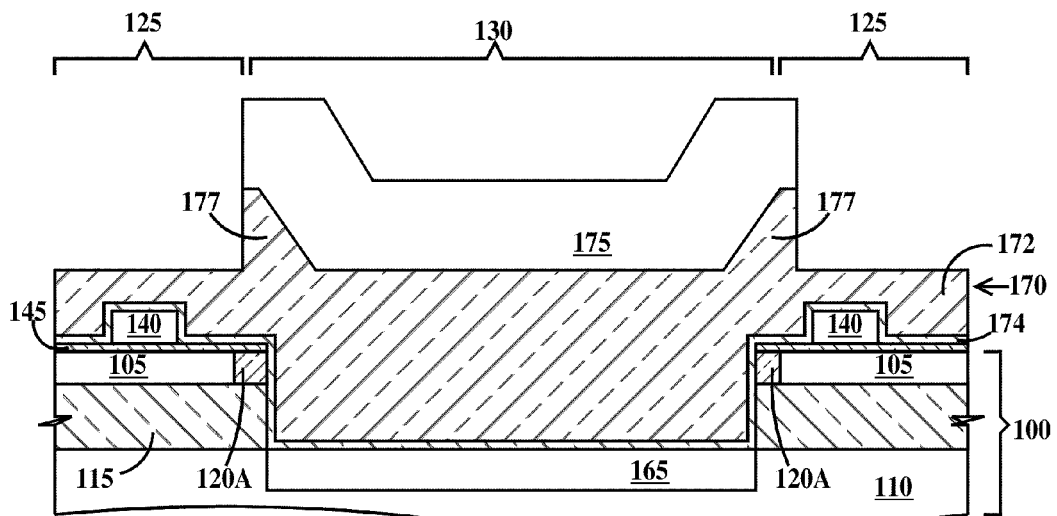
Figure 1J:
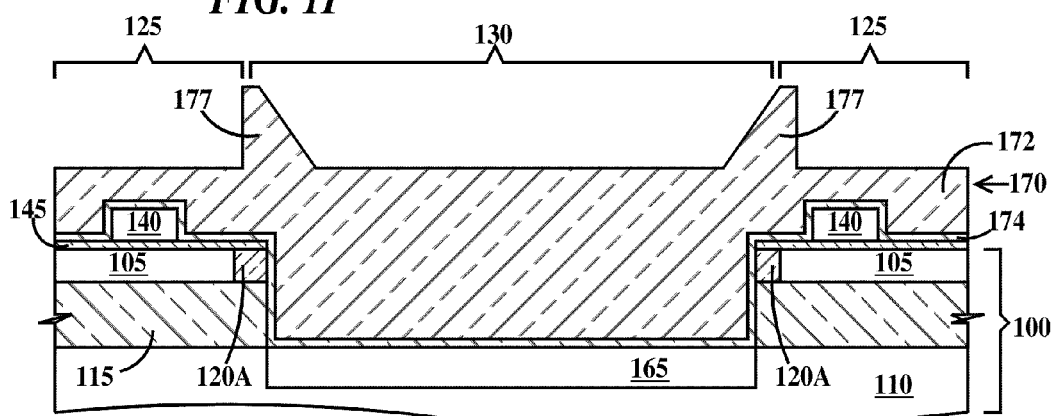
Figure 1K:
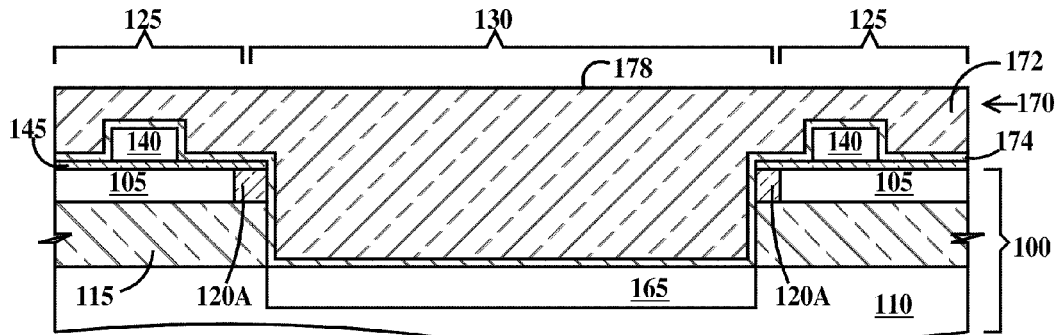

In FIG. 1H, a patterned photoresist layer 175 is formed on dielectric layer 170 in inactive region 130 and overlapping the active/inactive region boundary. In FIG. 1I, a timed etch (e.g., timed RIE) is performed to remove less than a full thickness of BPSG layer 174 where the BPSG layer is not protected by photoresist layer 175 and create peaks 177. In FIG. 1J, photoresist layer 175 (see FIG. 1I) is removed. The goal of steps 1H through 1J is to remove enough of the BPSG from over active regions 125 so as to minimize the area of peaks 177. In FIG. 1K, a CMP is performed to remove peaks 177 (see FIG. 1J) and produce a planar surface on BPSG layer 170 in both active and inactive regions 125 and 130. As can be seen from FIG. 1K, there are no structures or BOX in inactive region 130 other then the filling of dielectric layer 170 and implanted area 165. In the implantation of implanted area 165, the crystal structure is damaged and contains traps (e.g., dangling bounds) to convert mobile charge (electrons) to fixed charge (electrons). Completion of fabrication of the integrated circuit may now continue, with active devices being completed and wiring levels formed.

Figure 2A:
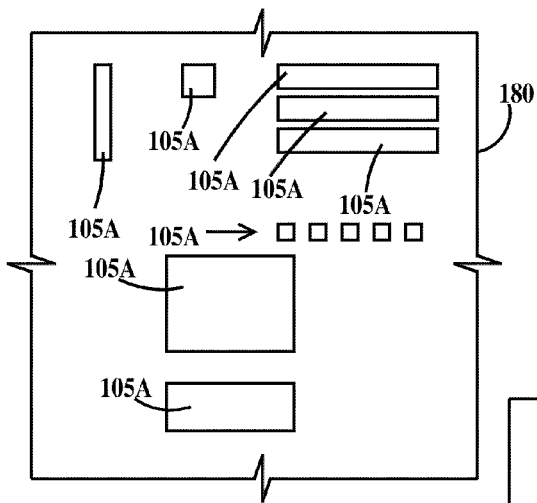
FIGS. 2A, 2B and 2C illustrate some of the photomask sets used to practice the method of FIGS. 1A through 1K.
Figure 2B:
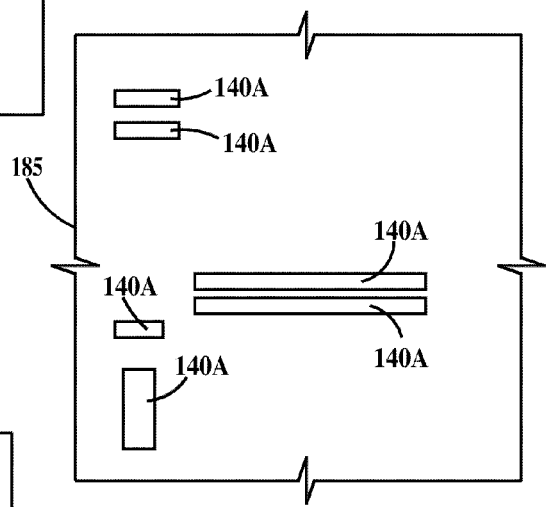
Figure 2C:
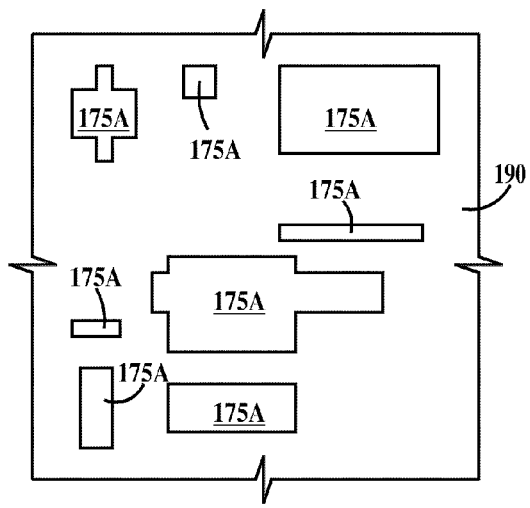

FIGS. 2A, 2B and 2C illustrate some of the photomask sets used to practice the method of FIGS. 1A through 1I. In FIG. 2A, a photomask 180 illustrates the mask shapes 105A used to define the pattern of silicon layer 105 and trench isolation 120B in active region 125 (see FIG. 1A). Mask shapes 105A correspond to silicon regions of silicon layer 105. In FIG. 2B, a photomask 185 illustrates the mask shapes 140A used to define the pattern of gate electrodes 140 in active region 125 (see FIG. 1A). Mask shapes 140A correspond to gate electrodes 140. In FIG. 2C, a photomask 190 illustrates the mask shapes 175A used to define the pattern of photoresist layer 175 of FIG. 1H. Whether the shapes are opaque, semi-opaque or clear depends upon the type of photomask and the contrast of the photoresist.

Figure 3A:
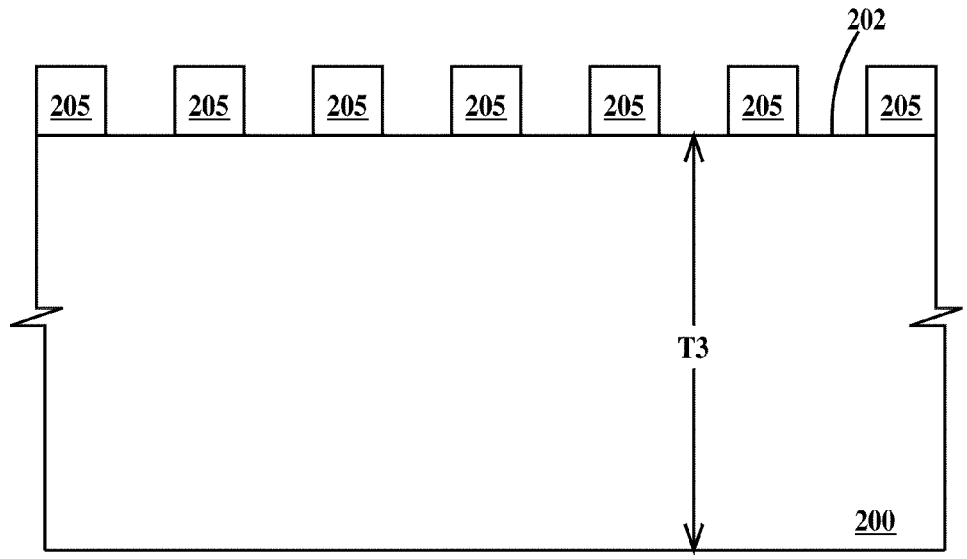

FIGS. 3A through 3L are cross-sections illustrating fabrication of a SOI substrate according to embodiments of the present invention. In FIG. 3A, a silicon substrate 200 has a thickness T3. Formed on a top surface 202 of substrate 200 is a patterned photoresist layer 205. In one example, substrate 200 is single-crystal silicon. In one example, substrate 200 is a wafer (i.e., disk) and T3 is about 700 microns. In one example, substrate 200 is a 200 mm or 300 mm diameter wafer.

Figure 3B:
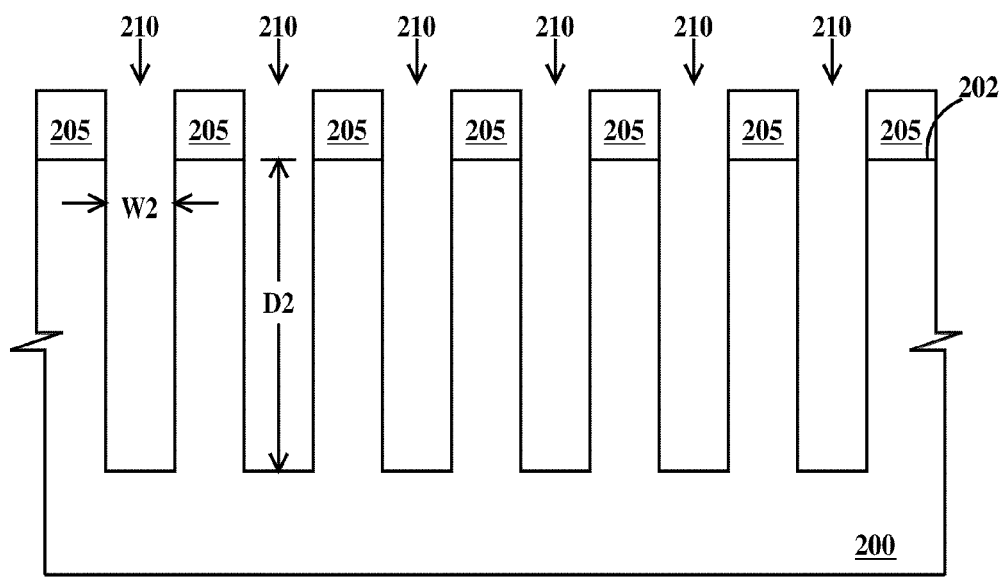

In FIG. 3B, trenches 210 are etched into substrate 200 using, for example and RIE. Trenches are W2 wide and D2 deep. Though trenches 210 are illustrated as having a same width at the top (proximate to top surface 202) and the bottom, they may have tapered sidewalls, being narrower at the bottom than at the top. In one example, W2 is greater than about 0.1 micron. In one example W2 is between about 0.1 micron and about 2 microns. In one example, D2 is greater than about 4 microns. In one example D2 is between about 2 microns and about 10 microns.

Alternatively, patterned photoresist layer 205 may be used to define a patterned hardmask layer on top surface 202, the photoresist removed, and the trenches etched through openings in the hardmask.

Figure 3C:
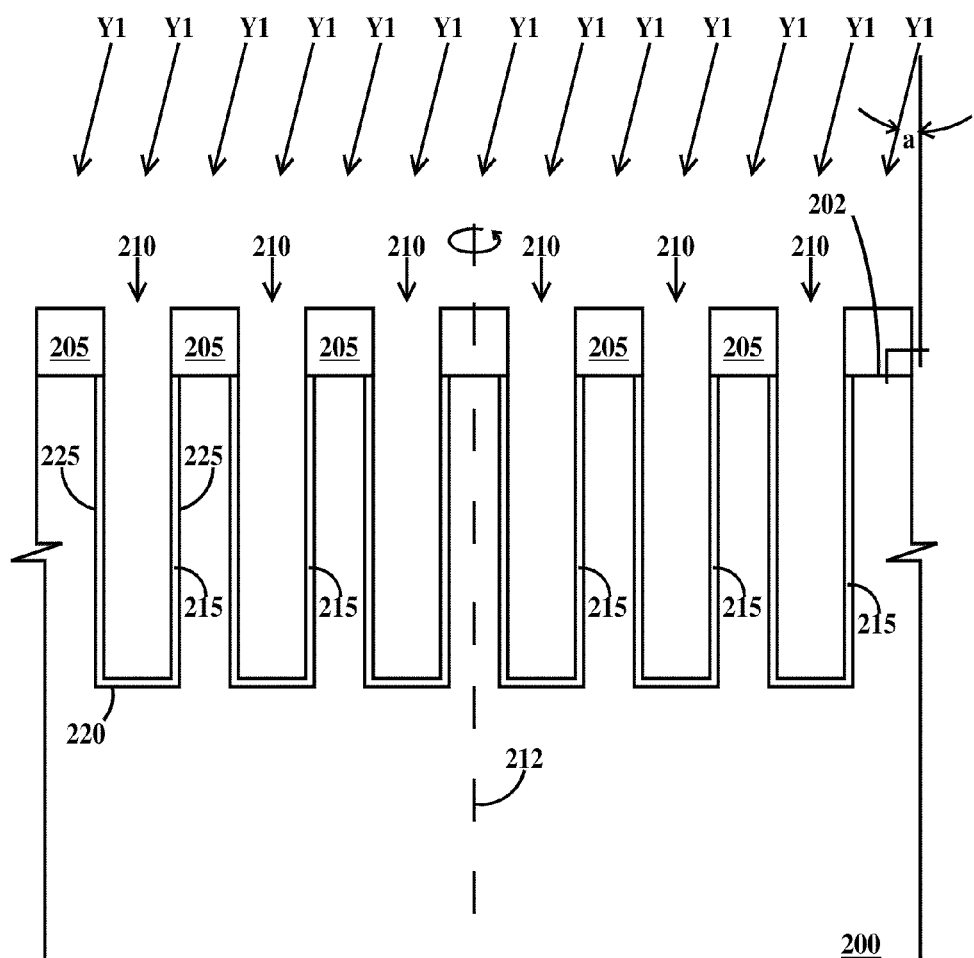

In FIG. 3C, an optional angled ion implantation at an angle "a" of species Y1 is performed while substrate 200 is rotating about a central axis 212 perpendicular to top surface 202 and passing through the geometric center of substrate 200. In one example, Y1 is selected from the group consisting of Ar, Ne, Kr and Xe, with Ar preferred. In one example, the ion implantation is performed at an energy of between about 20 KeV and about 200 KeV and at a dose of between about 1E15 atm/cm$^2$ and 1E16 atm/cm$^2$. In one example angle "a" is about the arc tan of W2/T3 (see FIG. 3B). The ion implantation forms an ion implanted region 215 on the sidewalls and bottom of trenches 210. The ion implantation of FIG. 3C may be performed before or after the ion implantation of FIG. 3D.

Figure 3D:
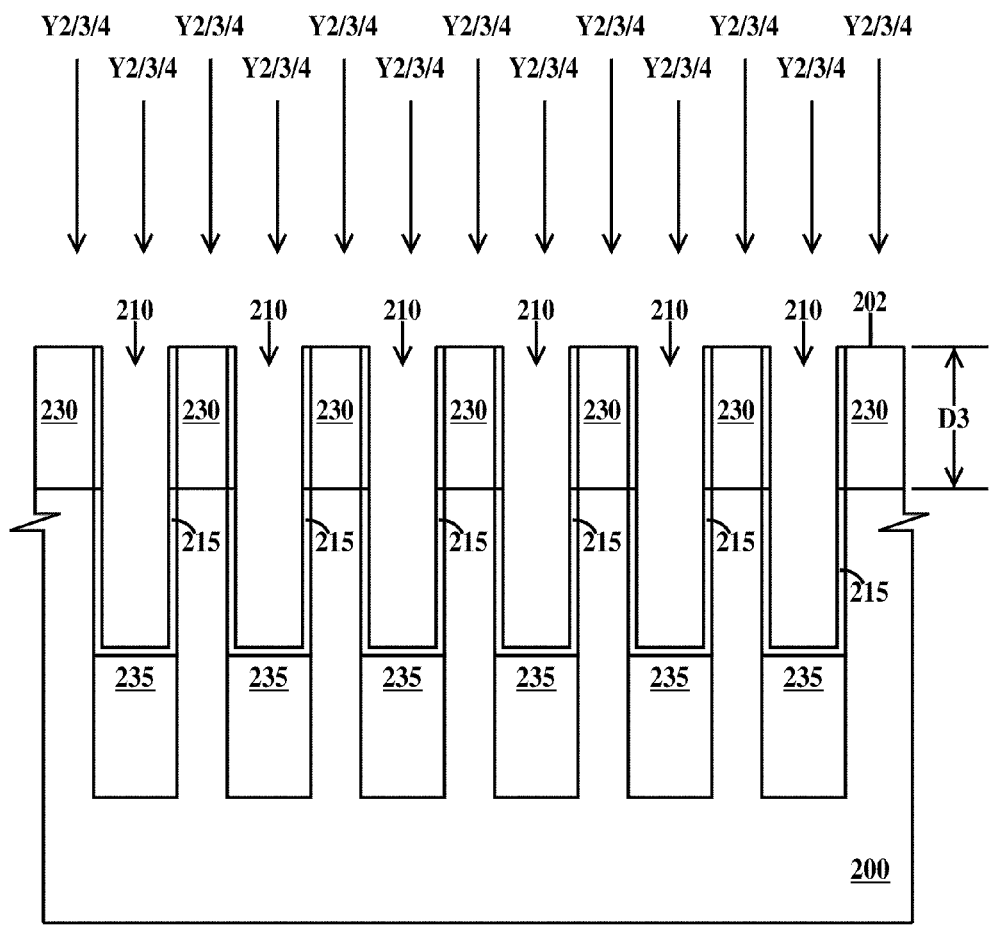

In FIG. 3D, photoresist layer 205 (see FIG. 3E) is removed (or the hardmask if a hardmask was used is removed) and between one and three (there may be more than three) ion implantations Y2, Y3 and Y4 are performed to form implanted regions 230 a distance D3 from top surface 202 into substrate 200 and implanted regions 235 at the bottom of trenches 210. In one example D3 is between about 0.1 micron and about 0.5 microns. In one example, Y2, Y3 and Y4 are independently selected from the group consisting of Ar, Ne, Kr and Xe, with Ar preferred. Each of the between one and three ion implants is performed at energies of between about 30 KeV and about 500 KeV and at a dose of between about 1E15 atm/cm$^2$ and 1E16 atm/cm$^2$ with the KeV increasing from the first to the second (if any) to the third (if any) ion implantation, thus increasing the distance into substrate 200 which each subsequent implant. It is preferred, when multiple ion implantations are performed, that the depth vs. implanted species concentration profiles of adjacent implants overlap.

Figure 3E:
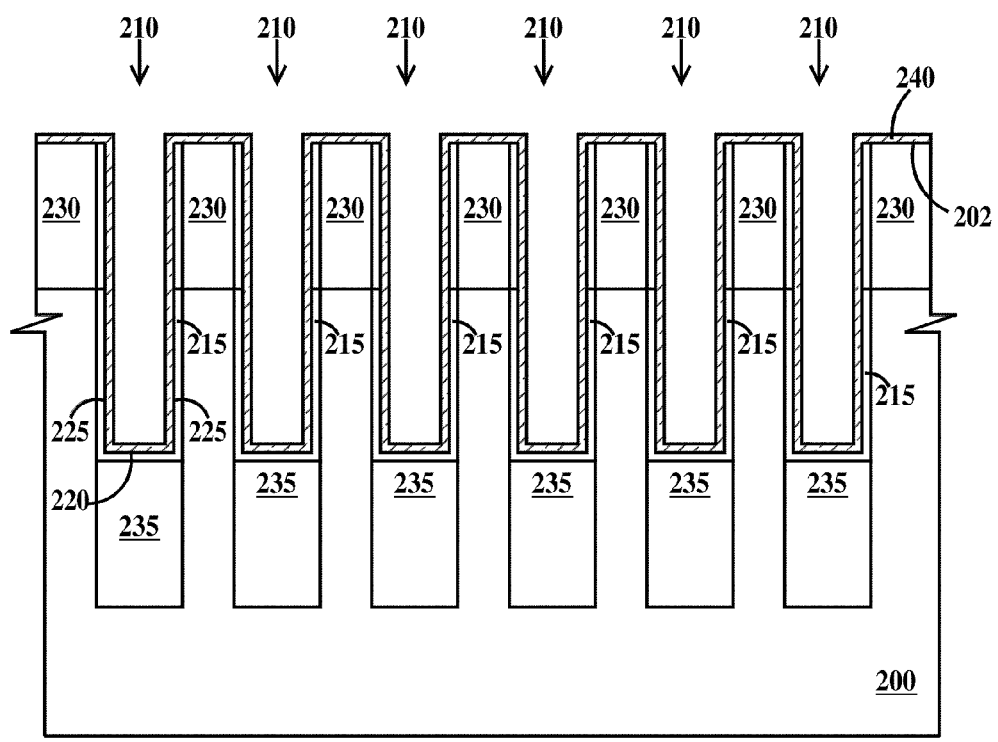

In FIG. 3E, a dielectric layer 240 is formed on top surface 202 of substrate 200 and on the bottoms 220 and sidewalls of 225 of trenches 210. In one example, dielectric layer 240 is silicon nitride, which may be conveniently formed by chemical vapor deposition (CVD). In one example, dielectric layer 240 is between about 20 nm and about 50 nm thick.

In FIG. 3F, a polysilicon layer 245 is deposited in trenches 210 and on dielectric layer 240. Polysilicon layer 245 has a thickness T4 over implanted regions 230. In one example, T4 is between about 600 nm and about 1000 nm. Top surface 242 of polysilicon layer 245 may include depressions 247 over trenches 210. While trenches 210 are illustrated as completely filled with polysilicon, it is possible for seams and/or voids to form as illustrated in FIG. 3F1 and 3F2.

In FIG. 3F1, a seam 250 is formed in polysilicon layer 245 during deposition and in FIG. 3F2 a void 255 is formed in polysilicon layer 245 during deposition.

Figure 3G:
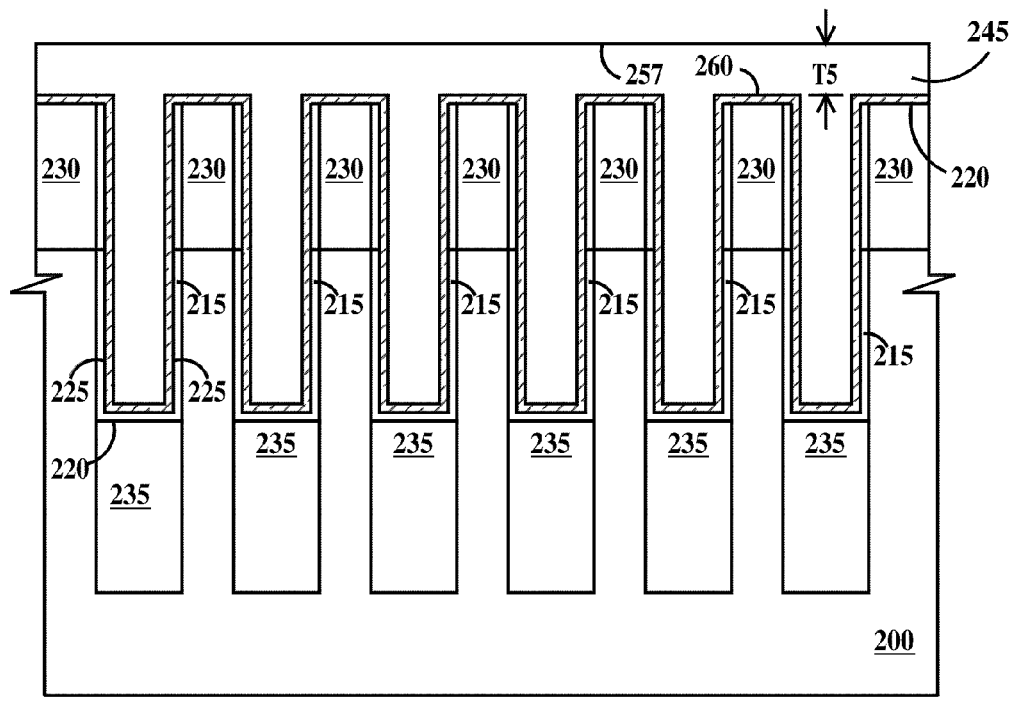

In FIG. 3G, an optional thermal activation anneal at a temperature between about 900° C. and about 1050° C. is performed followed a CMP to flatten a top surface 257 of polysilicon layer 245. After CMP, polysilicon layer 245 has a thickness T5 over implanted regions 230. In one example, T5 is between about 300 nm and about 400 nm.

Figure 3H:
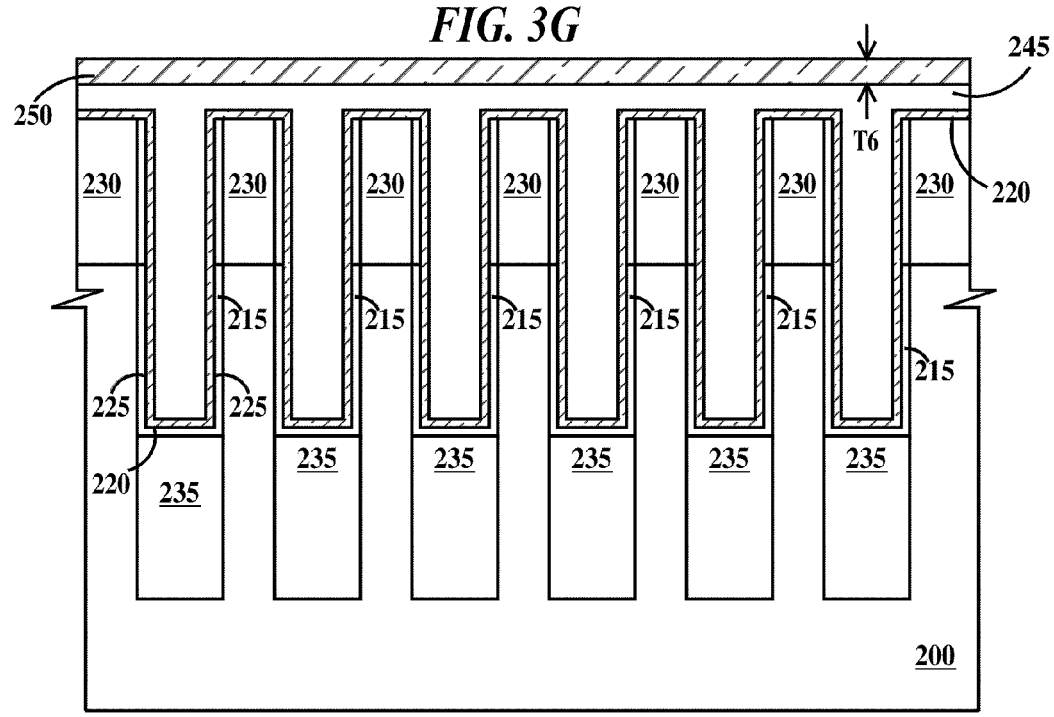

In FIG. 3H, a silicon oxide layer 245 is formed by oxidizing the exposed top surface 257 (see FIG. 3G). Silicon oxide layer 245 has a thickness T6. In one example, T6 is between about 200 nm and about 300 nm.

Figure 3I:
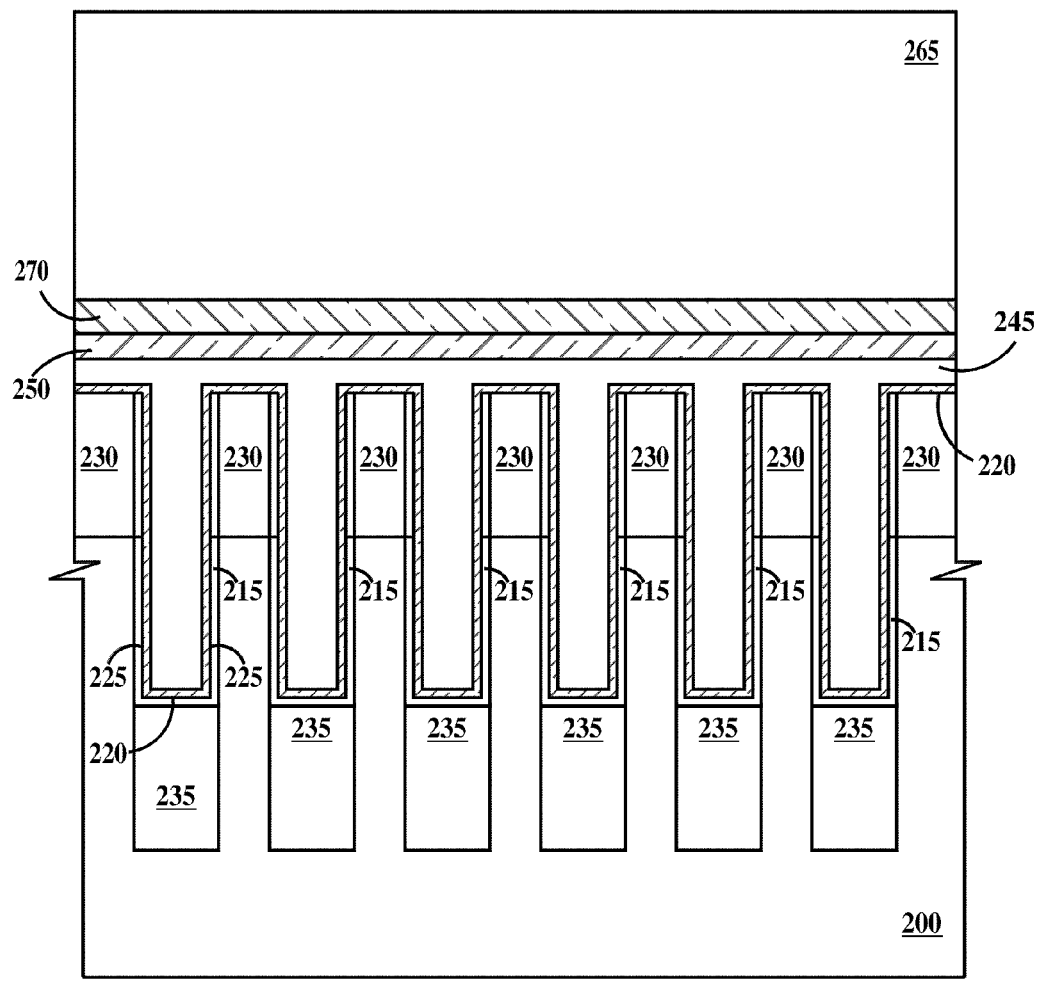

In FIG. 3I, a donor single-crystal silicon substrate 265 has a silicon oxide layer 270. Silicon oxide layer 270 of substrate 265 is bonded to silicon oxide layer 250 of substrate 200, for example, by thermal bonding or other techniques known in the art.

Figure 3J:
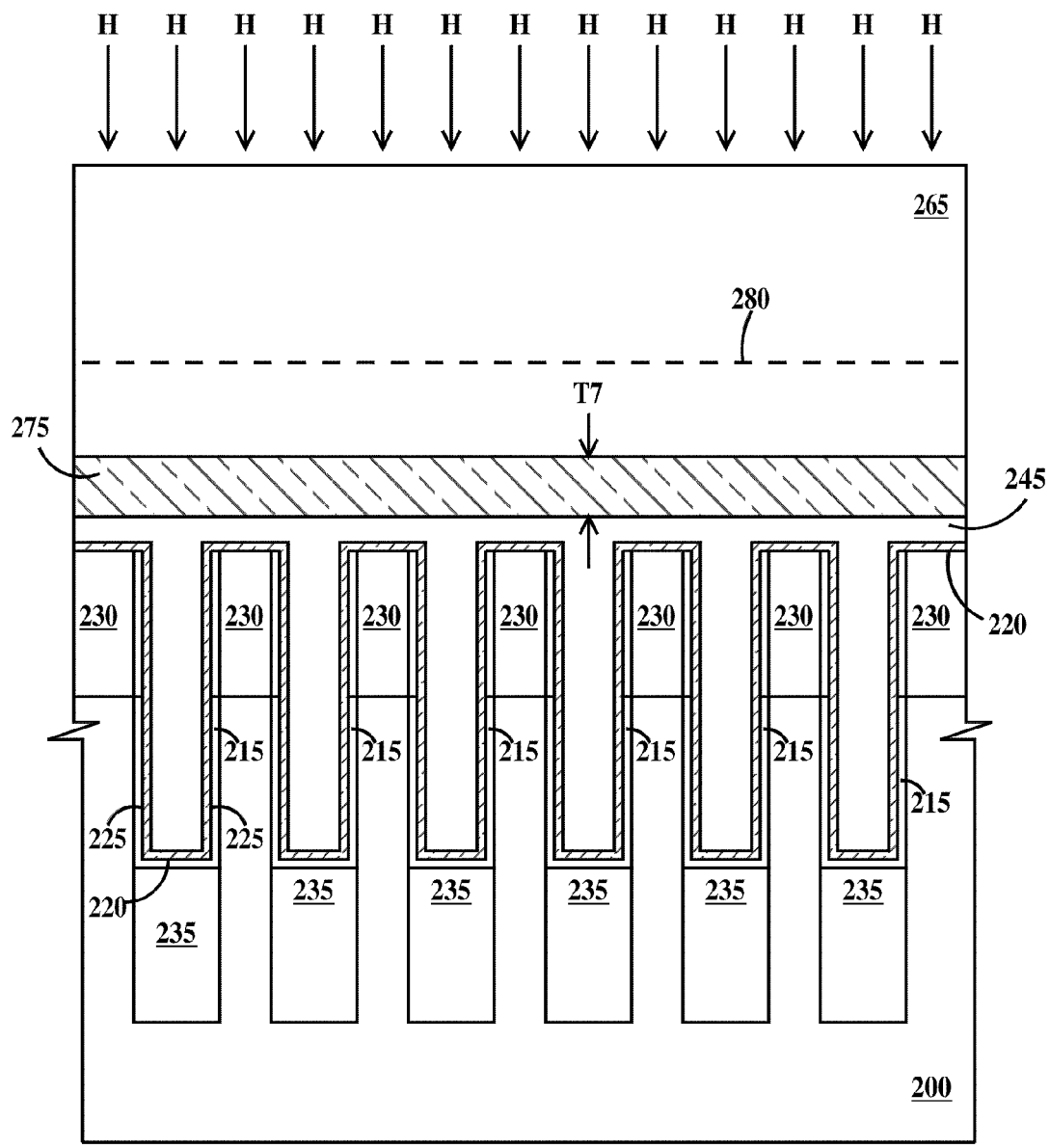

In FIG. 3J, after bonding, a BOX layer 275 is formed. BOX layer 275 has a thickness T7. In one example, T7 is between about 400 nm and about 1000 nm. A hydrogen ion implantation is performed to generate a fraction zone 280 is substrate 265.

Figure 3K:
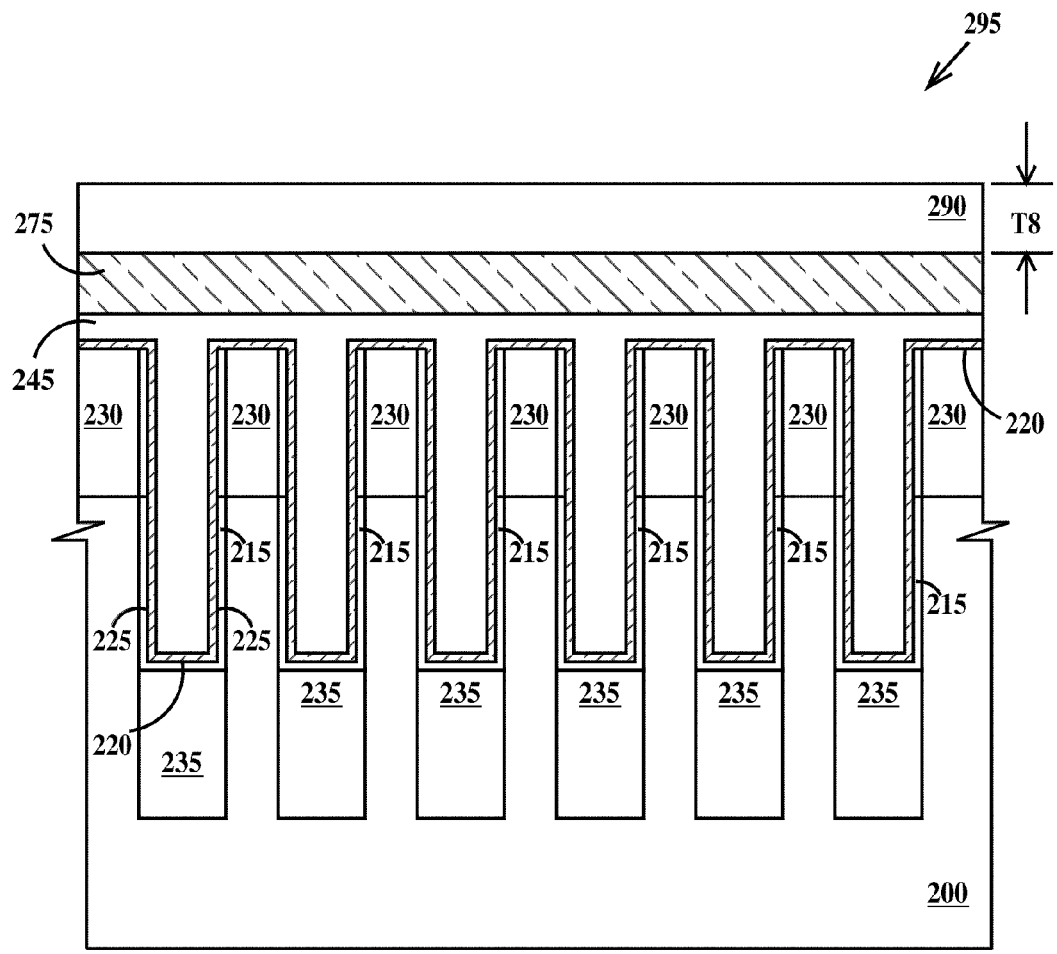

In FIG. 3K, substrate 265 is cleaved along fracture zone 280 and a CMP performed to form a single-crystal silicon layer 290 on BOX layer 275. In one example, T8 is between about 80 nm and about 200 nm. This completes fabrication of an SOI substrate 295. In the implantation of implanted regions 230 and 215, the crystal structure of substrate 200 is damaged and contains traps (e.g., dangling bounds) to convert mobile charge (electrons) to fixed charge (electrons). Completion of fabrication of the integrated circuit may now continue, with active devices being and wiring levels formed.

Figure 3L:
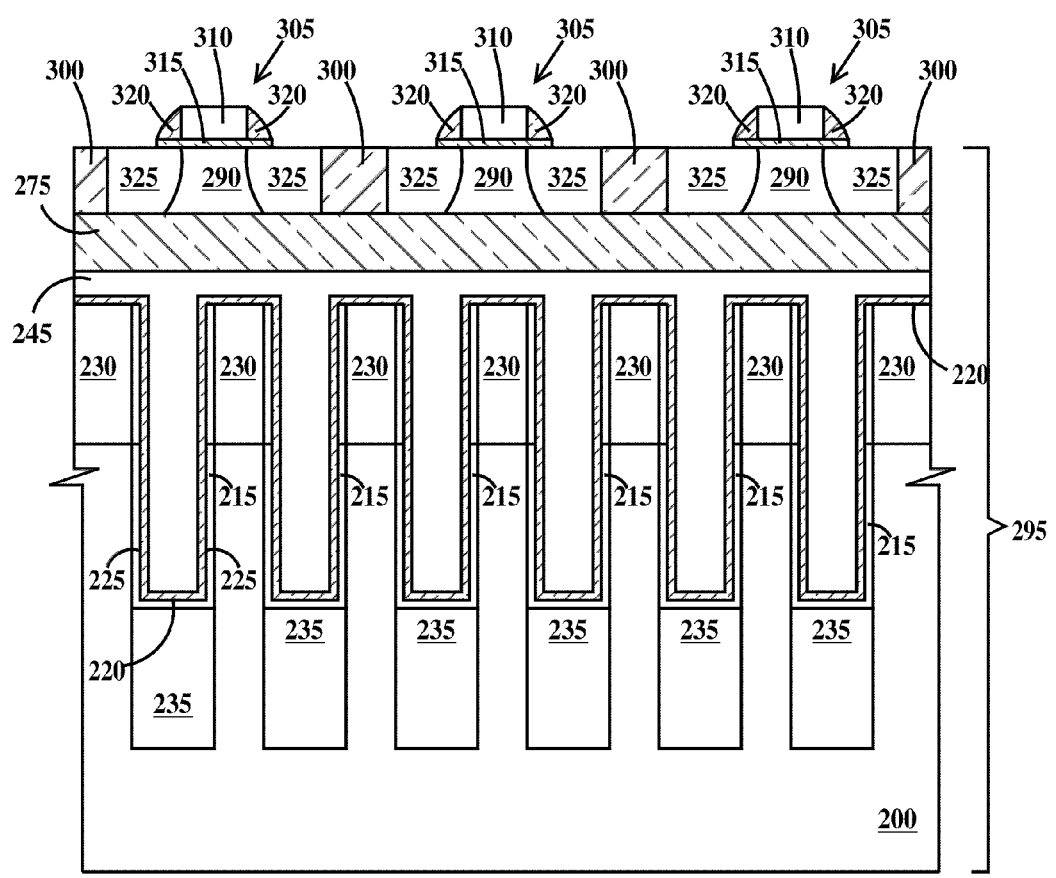

In FIG. 3L, dielectric trench isolation 300 is formed in silicon layer 280 and field effect transistors (FETs) 305 formed. FETs 305 include gates 310 separated from silicon layer 290 by a gate dielectric 315, dielectric spacers 320 formed on the sidewalls of gates 310 and source/drains formed in silicon layer 290 on opposite sides of gates 310.

Thus the embodiments of the present invention provide methods and structures with improved power loss and reduced non-linear parasitic capacitance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming gate structures in an active region and dummy gate structures in an inactive region and on a top surface of a silicon layer separated from a supporting substrate by a buried oxide layer;
   (b) removing said dummy gate structures and said buried oxide layer from said inactive regions to form a trench extending through said silicon layer and said buried oxide layer to said substrate;
   (c) ion implanting an electrically inert species into said substrate in said inactive regions and not into gate structures, said silicon layer, said buried oxide layer and said substrate in said active regions; and
   (d) depositing a dielectric material over said active and inactive regions to form a dielectric layer, said dielectric material filling said trench.

2. The method of claim 1, wherein after (d), a top surface of said dielectric layer over said active regions is coplanar with a top surface of said dielectric layer over said inactive region.

3. The method of claim 1, further including:
   before (a) forming dielectric trench isolation in said active region and dummy dielectric trench isolation in said inactive region, said dielectric trench isolation extending from said top surface of said silicon layer to said buried oxide layer; and
   (b) includes removing said dummy dielectric trench isolation from said inactive regions.

4. The method of claim 1, wherein said electrically inert species is selected from the group consisting argon, neon, krypton and xenon.

5. The method of claim 1, wherein said ion implanting damages the crystal structure of said substrate and creates traps to convert mobile charge to fixed charge.

* * * * *